United States Patent
Brown et al.

(10) Patent No.: US 6,990,640 B2
(45) Date of Patent: *Jan. 24, 2006

(54) DIMM AND METHOD FOR PRODUCING A DIMM

(76) Inventors: Patricia Brown, 7000 Sierra Ponds La., Granite Bay, CA (US) 95746; Derek Schumacher, 6525 Timberline Way, Rocklin, CA (US) 95765; Vince Leung, 1761 E. Roseville Pkwy., #735, Roseville, CA (US) 95661

( * ) Notice: Subject to any disclaimer, the term of this patent is extended or adjusted under 35 U.S.C. 154(b) by 0 days.

This patent is subject to a terminal disclaimer.

(21) Appl. No.: 10/698,686

(22) Filed: Oct. 31, 2003

(65) Prior Publication Data

US 2004/0090848 A1 May 13, 2004

Related U.S. Application Data

(63) Continuation of application No. 10/193,334, filed on Jul. 10, 2002, now Pat. No. 6,694,490.

(51) Int. Cl.
*G06F 17/50* (2006.01)

(52) U.S. Cl. ............................................. 716/1; 716/2

(58) Field of Classification Search ............... 711/5, 711/103, 115, 170–173; 710/302, 316; 714/25, 714/718–723, 710–711; 365/149, 201, 185.11, 365/230.02, 230.03, 222; 716/1–4

See application file for complete search history.

(56) References Cited

U.S. PATENT DOCUMENTS

| | | | |
|---|---|---|---|
| 4,805,093 A * | 2/1989 | Ward | 711/108 |
| 5,619,471 A | 4/1997 | Nunzlata | |
| 5,684,973 A | 11/1997 | Sullivan et al. | |
| 6,046,952 A * | 4/2000 | Novak et al. | 365/222 |
| 6,070,217 A | 5/2000 | Connolly et al. | |
| 6,118,719 A * | 9/2000 | Dell et al. | 365/222 |
| 6,147,921 A * | 11/2000 | Novak et al. | 365/222 |
| 6,208,273 B1 * | 3/2001 | Dye et al. | 341/51 |
| 6,289,421 B1 * | 9/2001 | Ali et al. | 711/149 |
| 6,295,582 B1 * | 9/2001 | Spencer | 711/135 |
| 6,295,591 B1 | 9/2001 | Bealkowski et al. | |
| 6,334,175 B1 | 12/2001 | Chih | |
| 6,397,290 B1 | 5/2002 | Williams et al. | |
| 6,487,623 B1 | 11/2002 | Emerson et al. | |
| 6,523,102 B1 * | 2/2003 | Dye et al. | 711/170 |
| 2002/0184579 A1 * | 12/2002 | Alvarez et al. | 714/719 |
| 2003/0061457 A1 * | 3/2003 | Geiger et al. | 711/165 |
| 2003/0105932 A1 * | 6/2003 | David et al. | 711/167 |
| 2003/0159092 A1 * | 8/2003 | La Fetra | 714/710 |
| 2003/0217239 A1 * | 11/2003 | Jeddeloh | 711/158 |

* cited by examiner

*Primary Examiner*—Matthew Smith
*Assistant Examiner*—Naum B. Levin

(57) ABSTRACT

A method for producing a DIMM having a reduced memory capacity. The method includes determining an amount by which a memory capacity of a DIMM can be reduced, and reducing the memory capacity of the DIMM in accordance with the determined amount to produce a DIMM having a reduced memory capacity which is available for use and a dormant memory capacity which is not available for use. A DIMM produced in accordance with the method. A computer assembly having a computer, and a DIMM disposed in the computer and having reduced memory capacity.

44 Claims, 3 Drawing Sheets

EXAMPLE OF MEMORY BEFORE REDUCING MEMORY CAPACITY - ALL AVAILABLE MEMORY CAN BE USED

EXAMPLE OF MEMORY AFTER REDUCING MEMORY CAPACITY - ONLY HALF IS USABLE. NOTE THAT ALL THE ORIGINAL MEMORY IS THERE ONLY HALF IS USABLE (ADDRESSABLE).

DIMM AND METHOD FOR PRODUCING A DIMM

CROSS-REFERENCE TO RELATED APPLICATION

This is application is related to co-pending application having application Ser. No. 10/193,774, by inventors Derek Schumacher and Vince Leung, filed Jul. 10, 2002, and entitled "A METHOD FOR CHANGING COMPUTER SYSTEM MEMORY DENSITY", which is hereby fully incorporated herein by reference. This application is a continuation of patent application having Ser. No. 10/193,334, filed Jul. 10, 2002, now U.S. Pat. No. 6,694,490 which is hereby fully incorporated herein by reference. Benefit of all earlier filing dates is claimed for all common subject matter.

BACKGROUND OF THE INVENTION

1. Field of the Invention

Embodiments of the present invention relate generally to computer systems. More particularly, embodiments of the present invention provide a reduced-memory capacity device and methods for producing a device having a reduced memory capacity. More particularly further, embodiments of the present invention provide a Dual Inline Memory Module (DIMM) and a method for furnishing and/or using a DIMM with a reduced memory capacity.

2. Description of the Background Art

DIMMs of different memory capacities are used in various devices, such as computers and servers. The memory capacity of a DIMM used in any particular device depends on the desired capabilities of the device. When a DIMM is in need of replacement, it is typically replaced with a DIMM of equal memory capacity as the cost of a DIMM increases with memory capacity. Thus, suppliers of DIMMs have to maintain a sufficient inventory of DIMMs of diverse memory capacities (i.e., multiple DIMM densities), because any particular product, such as a computer or server, requires support for the following DIMM densities: 256 MB, 512 MB, and 1 GB.

As technology continually improves, fewer and fewer devices or products are produced where a small memory capacity DIMM is employed. Assurance of supply of DRAMs used to produce smaller DIMM densities is becoming increasingly difficult and the current price/Mb for a DRAM density Mb of 128 Mb is approximately the same as, or is approaching that of, a DRAM density Mb of 64 Mb which is trailing edge DRAM technology. Therefore, suppliers are now faced with the problem of having to maintain inventory of essentially obsolete trailing edge DRAM technology in order to support the users of devices or products employing reduced-memory DIMM densities, such as devices or products with long lifespans (e.g., servers). Stated alternatively, suppliers currently have to continue to support multiple DIMM densities by having to procure and qualify end-of-life material (e.g., trailing edge DRAM technology). Thus, manufacturing processes remain complex because of the current use of different DRAM parts for multiple DIMM assemblies.

SUMMARY OF EMBODIMENTS OF THE INVENTION

Embodiments of the present invention provide a method for producing a device (e.g., a module) having a reduced memory capacity. The method includes determining that the memory capacity of the device can be reduced, determining an amount by which the memory capacity of the device is to be reduced, and reducing the memory capacity of the device in accordance with the determined amount to produce a device having a reduced memory capacity and a dormant memory capacity. The method may additionally include determining an available memory capacity of another device (e.g., a second module) in an apparatus (e.g., a computer) which requires the other device to have the available memory capacity. The difference between the memory capacity of the device and the memory capacity of the other device may approximate the dormant memory capacity. The method may further additionally comprise furnishing the apparatus with the device having the reduced memory capacity and the dormant memory capacity.

Embodiments of the present invention also provide a method for producing a DIMM having a reduced memory capacity comprising providing a DIMM having a memory capacity, determining that the memory capacity of the DIMM can be reduced, determining an amount by which the memory capacity of the DIMM is to be reduced, and reducing the memory capacity of the DIMM in accordance with the determined amount to produce a DIMM having a reduced memory capacity which is available for use and a dormant memory capacity which is not available for use. The method may further additionally comprise determining the total available memory capacity of another DIMM in an apparatus, such as a computer, which requires the other DIMM to have the available memory capacity. The available memory capacity of the other DIMM is less than the memory capacity of the DIMM, typically less than by multiples of an order of two (2). The method may further additionally comprise furnishing the apparatus with the DIMM having the reduced memory capacity which is available for use and the dormant memory capacity which is not available for use. The difference between the memory capacity of the DIMM and the memory capacity of the second DIMM comprises a dormant memory capacity. Reducing the memory capacity of the DIMM comprises disposing the DIMM in an EEPROM assembly, programming the EEPROM with a program which includes row, bank and column information, and executing the program in order to reduce the memory capacity of the DIMM. The method may also further additionally comprise replacing a DIMM in a apparatus, such as a computer, with a DIMM having a reduced memory capacity and a dormant memory capacity.

Additional embodiments of the present invention provide an assembly (e.g., a computer assembly) comprising an apparatus (e.g., a computer), and a device (e.g., a module or a DIMM) disposed in the apparatus and having a reduced memory capacity which is available for use and a dormant memory capacity which is not available for use. The device may be produced in accordance with any of the methods for embodiments of the present invention.

These provisions together with the various ancillary provisions and features which will become apparent to those artisans possessing skill in the art as the following description proceeds are attained by devices, assemblies, systems and methods of embodiments of the present invention, various embodiments thereof being shown with reference to the accompanying drawings, by way of example only, wherein:

DETAILED DESCRIPTION OF EMBODIMENTS OF THE INVENTION

In the description herein, numerous specific details are provided, such as examples of components and/or methods, to provide a thorough understanding of embodiments of the present invention. One skilled in the relevant art will recognize, however, that an embodiment of the invention can be practiced without one or more of the specific details, or with other apparatus, systems, assemblies, methods, components, materials, parts, and/or the like. In other instances, well-known structures, materials, or operations are not specifically shown or described in detail to avoid obscuring aspects of embodiments of the present invention.

A "computer" for purposes of embodiments of the present invention may be any processor-containing device, such as a mainframe computer, a personal computer, a laptop, a notebook, a microcomputer, a server, or any of the like. "EEPROM" means an electrically erasable programmable read-only memory.

Figure 1:
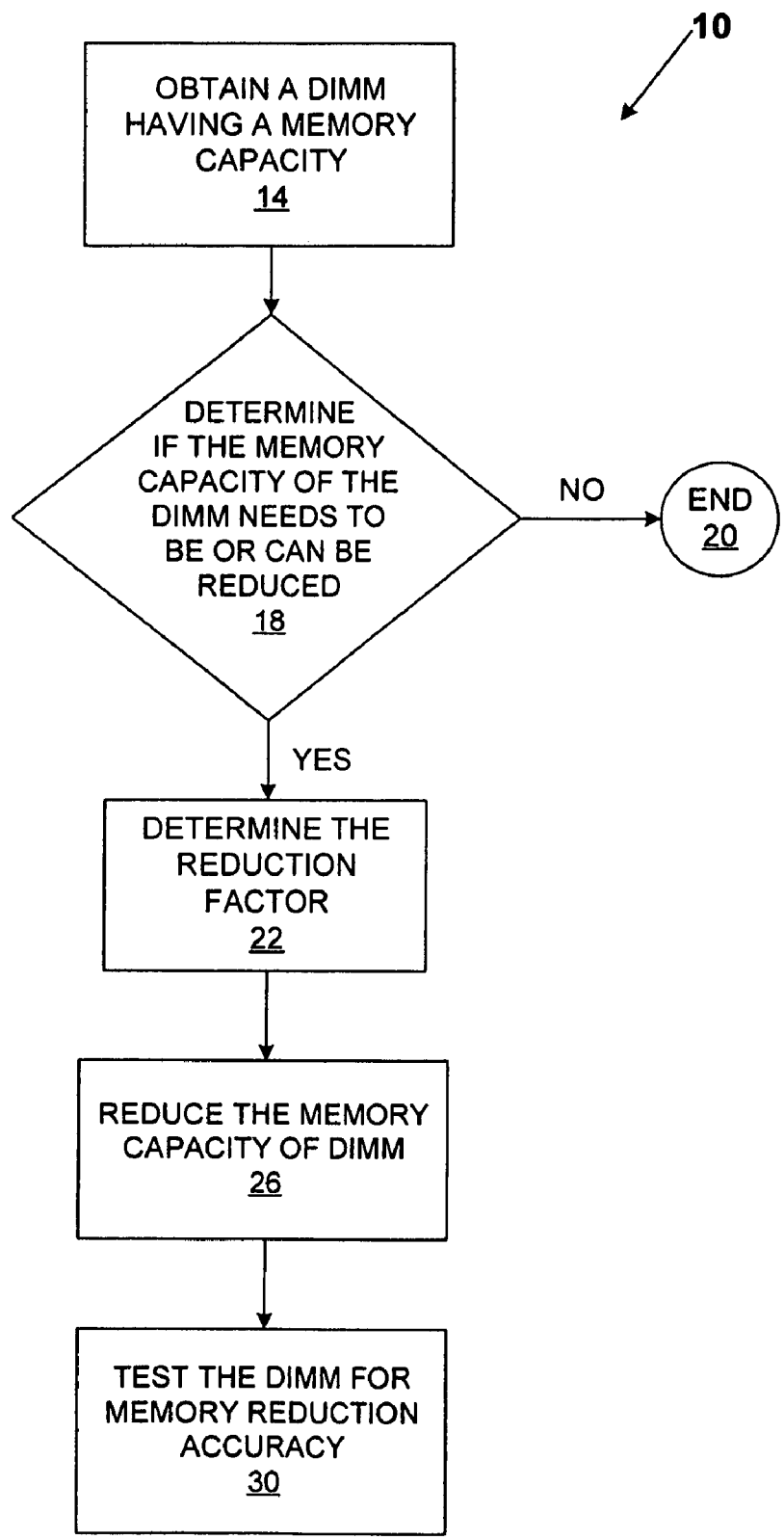
FIG. 1 is schematic block-flow diagram illustrating an embodiment for producing or furnishing a DIMM having a reduced memory capacity.

Referring now to FIG. 1 there is seen a schematic block-flow diagram of a process, generally illustrated as 10, for reducing the memory capacity of a device, such as a module or a DIMM. It is to be understood that while the illustration and description of the memory-reduction process will use a DIMM, the spirit and scope of embodiments of the present invention would include any device having a memory capacity for which a reduction may be desired.

The process includes, as represented by block 14, obtaining a DIMM having a memory capacity (e.g., 512 MB). Subsequently, a determination is made as to whether or not the memory capacity of the DIMM needs to be or is capable of being reduced, as represented by block 18 in FIG. 1. Thus, by way of example only, if a computer DIMM with a memory capacity of 256 MB is to be replaced, it would be replaced with a computer DIMM having the same memory capacity of 256 MB, and not with a computer DIMM having a memory capacity of 128 MB or 64 MB. Therefore, the DIMM whose memory capacity is to reduce would have a memory capacity greater than 256 MB. Otherwise, no memory reduction would be required and the process would terminate as represented by circle 20.

After a determination has been made as to whether or not the memory capacity of the DIMM needs to be or can be reduced, a determination is then made as to the amount of reduction in memory capacity which is to be conducted, as represented by block 22. Thus, if a computer DIMM with a memory capacity of 128 MB is to be replaced, and the DIMM whose memory capacity is to be reduced has a memory capacity of 512 MB, the amount of required reduction in the memory capacity of the DIMM would be 384 MB, or the reduction would be by a factor of four (4); that is, 512 MB divided by four (4) equals the reduced memory capacity of 128 MB. The reduction factor would be some power (e.g., the first power, the second power, the third power, etc.) of the integer two (2).

Figure 2:
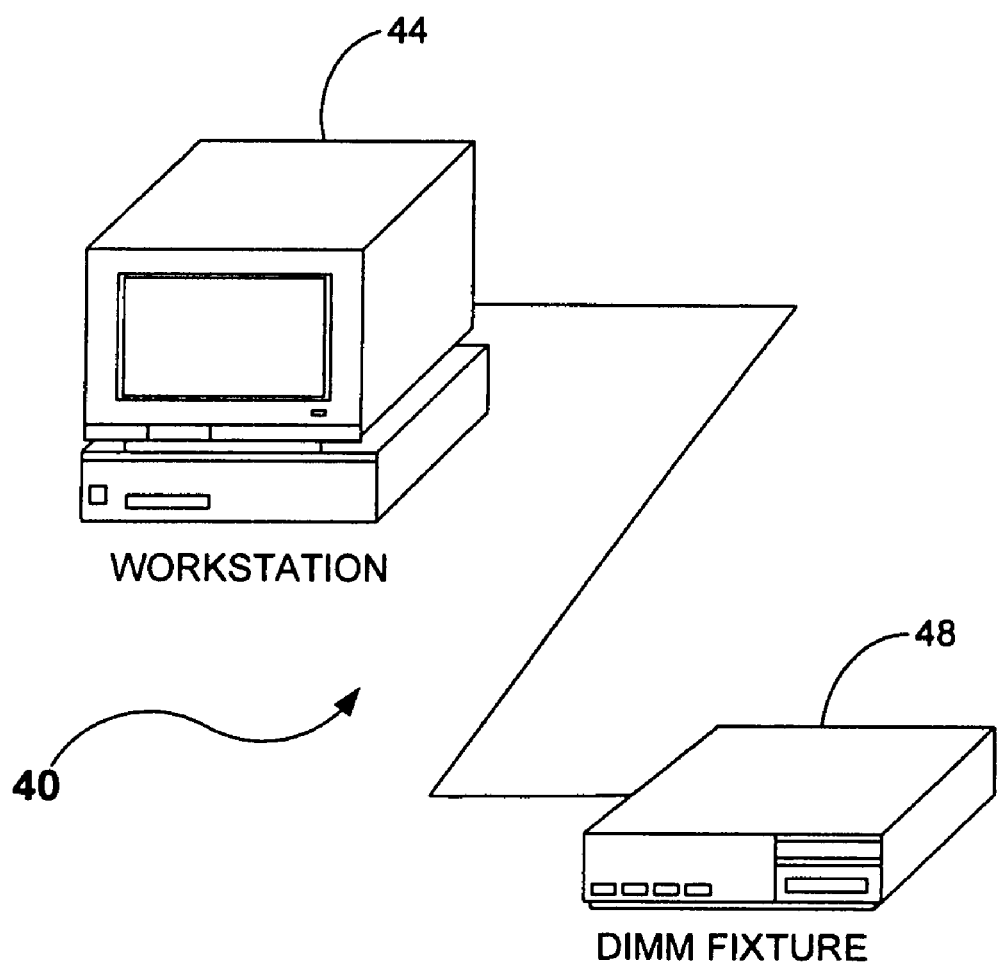
FIG. 2 is a perspective view of an EEPROM programming assembly.

After a determination has been made as to the amount (i.e., the reduction factor or by what power of 2) of reduction in memory capacity is desired or needed, the desired memory capacity reduction is subsequently conducted or performed on the DIMM. The memory capacity of the DIMM may be reduced by any suitable means, or with any suitable assembly, such as the EEPROM assembly 40 of FIG. 2 and in accordance with the instructions of block 26 in FIG. 1.

Figure 3:
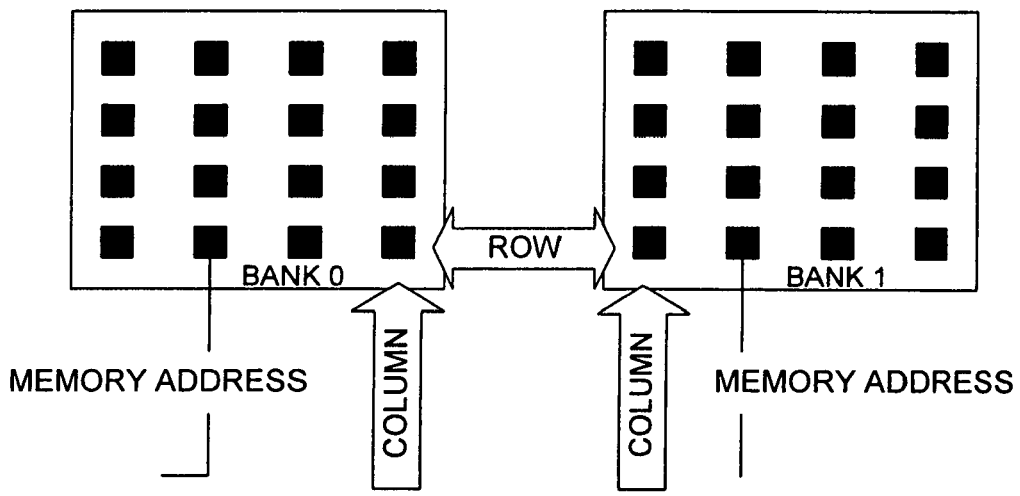
FIG. 3 is a schematic partial top plan view of a DIMM before reducing memory capacity.
Figure 4:
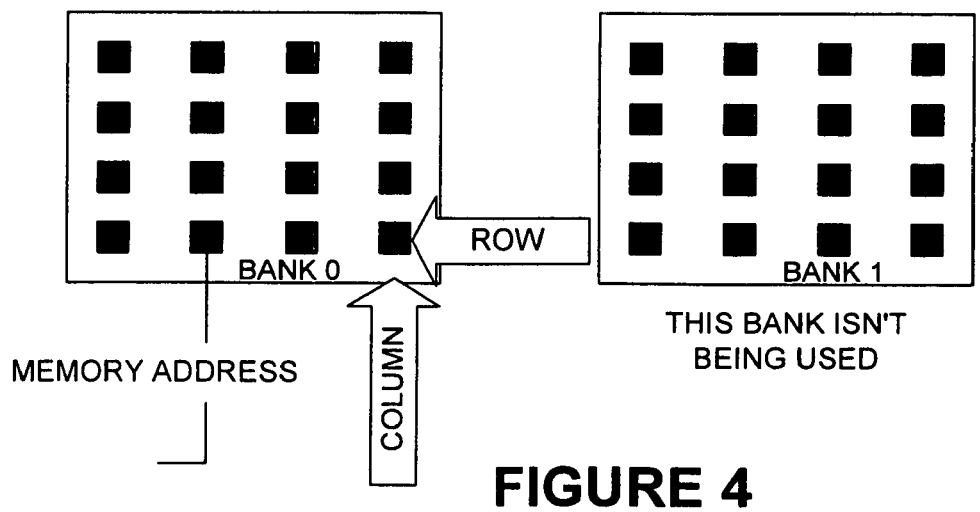
FIG. 4 is a schematic partial top plan view of the DIMM of FIG. 3 after reducing its memory capacity, more specifically at least one row and/or column of a bank.

The EEPROM assembly 40 includes a workstation 44 and a DIMM fixture 48. The DIMM, whose memory capacity is to be reduced, is installed into the DIMM fixture 48. Subsequently, reduced memory capacity information for the DIMM is entered into the workstation 44. This information would include row, column, and bank information which is to be programmed into the EEPROM and represents and/or corresponds to the desired reduced memory capacity. After the reduction-in-memory program has been entered into the workstation 44, the row, column and bank information (i.e., reduction in memory capacity information) of the program entered into the workstation 44 will be transferred to the DIMM for erasing the desired memory capacity of the DIMM. By way of example only and referencing now FIG. 3, there is seen a top plan view of a memory address or capacity for a DIMM, including Bank 0 and Bank 1 with each bank having 4 columns and 4 rows. After the memory capacity of the DIMM has been reduced (e.g., by one-half) by the EEPROM assembly 40 of FIG. 2, part of the original memory of the DIMM has been made unusable and is dormant. As illustrated in FIG. 4, all of the original memory (i.e., the memory of Bank 0 and Bank 1) of the DIMM is still there, but only half (i.e., Bank 0) is usable or addressable. The memory capacity of Bank 1 has been inactivated. Thus, the reduced memory capacity DIMM may now be used in a computer that requires only the memory capabilities possessed by bank 0, because the computer would not be able to use any memory capabilities originally possessed by Bank 1.

It is to be understood that while an entire bank has been made unusable and/or dormant, the spirit and scope of the present invention includes making at lest part of a bank unusable and/or dormant. Thus, at least one row and/or at least one column of one or more banks may be made unusable and/or dormant. Therefore, with respect to FIG. 3, instead of four columns and four rows of Bank 1 being unusable and/or dormant, one or more rows and/or one or more columns may be selectively made dormant and/or unaddressable.

Before the reduced memory DIMM is used, it should be tested in accordance with block 30 of FIG. 1 for memory-reduction accuracy to ensure that desired amount of memory was accurately reduced or removed from the DIMM and that the required amount of memory is available on the DIMM. Testing may be by any suitable means, such as by inserting the reduced-memory DIMM into a testing computer system. When power is applied to the testing computer system, firmware initialization begins, along with memory initialization which determines what capacity of DIMM is installed in the testing computer system. Firmware obtains the row, column, and bank information, from which DIMM density MB may be determined. More specifically, firmware will test the addressable space specified by the information from the DIMM EEPROM. Once the operating system of the testing computer system is launched, the addressable memory ranges are passed to the operating system for use. The unaddressable memory (i.e., dormant memory) is not available for use.

By the practice of various embodiments of the present invention, a manufacturer is allowed to discontinue carrying older, essentially obsolete 64 Mb DRAM technology, particularly when the price/Mb between the 128 Mb DRAM and 64 Mb DRAM are approximately the same. It also allows a manufacturer to continue to sell all the DIMMs of various densities that is demanded without the necessity of having to produce and stock numerous DIMM densities. Thus, the amount of parts for manufacture to stock in order to build memory is decreased. Additional practice of various embodiments of the present invention further allows a manufacturer to memory qualify only one type of DIMM rather than multiple DIMMs; thus, qualifying 512 MB would inherently qualify 256 MB. Other possible embodiments in accordance with the invention includes, for example, using a 1 gigabyte DIMM with a 256 megabit DRAM. Other suitable permutations are also permissible within the scope of embodiments of the invention.

Reference throughout this specification to "one embodiment", "an embodiment", or "a specific embodiment" means that a particular feature, structure, or characteristic described in connection with the embodiment is included in at least one embodiment of the present invention and not necessarily in all embodiments. Thus, respective appearances of the phrases "in one embodiment", "in an embodiment", or "in a specific embodiment" in various places throughout this specification are not necessarily referring to the same embodiment. Furthermore, the particular features, structures, or characteristics of any specific embodiment of the present invention may be combined in any suitable manner with one or more other embodiments. It is to be understood that other variations and modifications of the embodiments of the present invention described and illustrated herein are possible in light of the teachings herein and are to be considered as part of the spirit and scope of the present invention.

Further, at least some of the components of an embodiment of the invention may be implemented by using a programmed general purpose digital computer, by using application specific integrated circuits, programmable logic devices, or field programmable gate arrays, or by using a network of interconnected components and circuits. Connections may be wired, wireless, by modem, and the like.

It will also be appreciated that one or more of the elements depicted in the drawings/figures can also be implemented in a more separated or integrated manner, or even removed or rendered as inoperable in certain cases, as is useful in accordance with a particular application. It is also within the spirit and scope of the present invention to implement a program or code that can be stored in a machine-readable medium to permit a computer to perform any of the methods described above.

Additionally, any signal arrows in the drawings/Figures should be considered only as exemplary, and not limiting, unless otherwise specifically noted. Furthermore, the term "or" as used herein is generally intended to mean "and/or" unless otherwise indicated. Combinations of components or steps will also be considered as being noted, where terminology is foreseen as rendering the ability to separate or combine is unclear.

As used in the description herein and throughout the claims that follow, "a", "an", and "the" includes plural references unless the context clearly dictates otherwise.

Also, as used in the description herein and throughout the claims that follow, the meaning of "in" includes "in" and "on" unless the context clearly dictates otherwise.

The foregoing description of illustrated embodiments of the present invention, including what is described in the Abstract, is not intended to be exhaustive or to limit the invention to the precise forms disclosed herein. While specific embodiments of, and examples for, the invention are described herein for illustrative purposes only, various equivalent modifications are possible within the spirit and scope of the present invention, as those skilled in the relevant art will recognize and appreciate. As indicated, these modifications may be made to the present invention in light of the foregoing description of illustrated embodiments of the present invention and are to be included within the spirit and scope of the present invention.

Thus, while the present invention has been described herein with reference to particular embodiments thereof, a latitude of modification, various changes and substitutions are intended in the foregoing disclosures, and it will be appreciated that in some instances some features of embodiments of the invention will be employed without a corresponding use of other features without departing from the scope and spirit of the invention as set forth. Therefore, many modifications may be made to adapt a particular situation or material to the essential scope and spirit of the present invention. It is intended that the invention not be limited to the particular terms used in following claims and/or to the particular embodiment disclosed as the best mode contemplated for carrying out this invention, but that the invention will include any and all embodiments and equivalents falling within the scope of the appended claims.

What is claimed is:

1. A method for producing a device having a reduced memory capacity comprising:
   providing a device having a memory capacity;
   determining that the memory capacity of the device can be reduced;
   determining an amount by which the memory capacity of the device is to be reduced;
   reducing the memory capacity of the device in accordance with the determined amount to produce a device having a reduced memory capacity and a dormant memory capacity, wherein the memory capacity is reduced by inactivating at least one row of a memory bank of the device or at least one column of the memory bank of the device; and
   furnishing an apparatus with said device having said reduced memory capacity and the dormant memory capacity which is not available for use, wherein the at least one row of the memory bank that is inactivated is made unusable and is prevented from storing data, and wherein the at least one column of the memory bank that is inactivated is made unusable and is prevented from storing data.

2. The method of claim 1 wherein said device comprises a module.

3. The method of claim 1 wherein said device comprises a module.

4. A device produced in accordance with the method of claim 1.

5. The method of claim 1 additionally comprising testing the produced device for a reduced memory-capacity accuracy and for a dormant memory-capacity accuracy.

6. The method of claim 1, wherein inactivating the at least one row or at least one column comprises:

making the at least one row or at least one column as dormant.

7. The method of claim 1, wherein inactivating the at least one row or at least one column comprises:
making the at least one row or at least one column as unaddressable.

8. The method of claim 1, wherein the reduced memory capacity is equal to a memory capacity of another device that is to be replaced in a computer.

9. An assembly comprising an apparatus; and a device disposed in said apparatus and having a reduced memory capacity and a dormant memory capacity, wherein a memory capacity of the device is reduced in accordance with a determined amount in order to achieve the reduced memory capacity, wherein the memory capacity is reduced by inactivating at least one row of a memory bank of the device or at least one column of the memory bank of the device, wherein said apparatus is furnished with said device having said reduced memory capacity and the dormant memory capacity which is not available for use, wherein the at least one row of the memory bank that is inactivated is made unusable and is prevented from storing data, and wherein the at least one column of the memory bank that is inactivated is made unusable and is prevented from storing data.

10. The assembly of claim 9 wherein said device having been produced in accordance with the following steps:
providing the device having a memory capacity;
determining that the memory capacity of the device can be reduced;
determining an amount by which the memory capacity of the device is to be reduced; and
reducing the memory capacity of the device in accordance with the determined amount to produce the device having the reduced memory capacity and the dormant memory capacity.

11. The assembly of claim 9, wherein a determination is made if the memory capacity of the device can be reduced prior to determination of the determined amount.

12. The assembly of claim 9, wherein inactivating the at least one row or at least one column comprises:
making the at least one row or at least one column as dormant.

13. The assembly of claim 9, wherein inactivating the at least one row or at least one column comprises:
making the at least one row or at least one column as unaddressable.

14. The assembly of claim 9, wherein the reduced memory capacity is equal to a memory capacity of another device that is to be replaced in the apparatus.

15. A computer assembly comprising a computer; and a dual inline memory module (DIMM) disposed in said computer and having a reduced memory capacity and a dormant memory capacity, wherein a memory capacity of the DIMM is reduced in accordance with a determined amount in order to achieve the reduced memory capacity, wherein the memory capacity is reduced by inactivating at least one row of a memory bank of the DIMM or at least one column of the memory bank of the DIMM, wherein the at least one row of the memory bank that is inactivated is made unusable and is prevented from storing data, and wherein the at least one column of the memory bank that is inactivated is made unusable and is prevented from storing data.

16. The computer assembly of claim 15 wherein said DIMM having been produced in accordance with the following steps:
providing the DIMM having a memory capacity;
determining that the memory capacity of the DIMM can be reduced;
determining an amount by which the memory capacity of the DIMM is to be reduced; and
reducing the memory capacity of the DIMM in accordance with the determined amount to produce the DIMM having the reduced memory capacity and the dormant memory capacity.

17. The assembly of claim 15, wherein a determination is made if the memory capacity of the DIMM can be reduced prior to determination of the determined amount.

18. The computer assembly of claim 15, wherein inactivating the at least one row or at least one column comprises:
making the at least one row or at least one column as dormant.

19. The computer assembly of claim 15, wherein inactivating the at least one row or at least one column comprises:
making the at least one row or at least one column as unaddressable.

20. The computer assembly of claim 15, wherein the reduced memory capacity is equal to a memory capacity of another DIMM that is to be replaced in the computer.

21. A method for producing a device having a reduced memory capacity, the method comprising:
providing a device having a memory capacity;
determining an amount of reduction for the memory capacity of the device;
reducing the memory capacity of the device by the amount of reduction in order to produce a device having a reduced memory capacity and a dormant memory capacity, wherein the memory capacity is reduced by inactivating at least one row of a memory bank of the device or at least one column of the memory bank of the device; and
furnishing an apparatus with said device having said reduced memory capacity and the dormant memory capacity which is not available for use, wherein the at least one row of the memory bank that is inactivated is made unusable and is prevented from storing data, and wherein the at least one column of the memory bank that is inactivated is made unusable and is prevented from storing data.

22. The method of claim 21, wherein the device comprises a DIMM.

23. The method of claim 21, wherein reducing the memory capacity of the device comprises:
making at least one row of a memory bank in the device as dormant.

24. The method of claim 21, wherein reducing the memory capacity of the device comprises:
making at least one column of a memory bank in the device as dormant.

25. The method of claim 21, wherein reducing the memory capacity of the device comprises:
making at least one memory bank of the device as dormant.

26. The method of claim 21, further comprising:
testing the device for memory-reduction accuracy to ensure that a desired amount of memory capacity was reduced in the device.

27. A device produced in accordance with the method of claim 21.

28. The method of claim 21, further comprising:
prior to determining the amount of reduction, determining if the memory capacity of the device can be reduced.

29. The method of claim 21, wherein inactivating the at least one row or at least one column comprises:
  making the at least one row or at least one column as dormant.

30. The method of claim 21, wherein inactivating the at least one row or at least one column comprises:
  making the at least one row or at least one column as unaddressable.

31. The method of claim 21, wherein the reduced memory capacity is equal to a memory capacity of another device that is to be replaced in a computer.

32. An apparatus comprising:
  a device having a reduced memory capacity and a dormant memory capacity, wherein a memory capacity of the device is reduced in accordance with a determined amount in order to achieve the reduced memory capacity, wherein the memory capacity is reduced by inactivating at least one row of a memory bank of the device or at least one column of the memory bank of the device, wherein said apparatus is furnished with said device having said reduced memory capacity and the dormant memory capacity which is not available for use, wherein the at least one row of the memory bank that is inactivated is made unusable and is prevented from storing data, and wherein the at least one column of the memory bank that is inactivated is made unusable and is prevented from storing data.

33. The apparatus of claim 32, wherein the device comprises a DIMM.

34. The apparatus of claim 32, wherein the device is produced in accordance with a method comprising:
  providing the device having a memory capacity; and
  reducing the memory capacity of the device by an amount of reduction in order to produce a device having a reduced memory capacity and a dormant memory capacity.

35. The apparatus of claim 34, wherein reducing the memory capacity of the device comprises:
  making at least one row of a memory bank in the device as dormant.

36. The apparatus of claim 34, wherein reducing the memory capacity of the device comprises:
  making at least one column of a memory bank in the device as dormant.

37. The apparatus of claim 34, wherein reducing the memory capacity of the device comprises:
  making at least one memory bank of the device as dormant.

38. The apparatus of claim 34, wherein the method further comprises:
  testing the device for memory-reduction accuracy to ensure that a desired amount of memory capacity was reduced in the device.

39. The apparatus of claim 32, wherein a determination is made if the memory capacity of the device can be reduced.

40. The apparatus of claim 32, wherein inactivating the at least one row or at least one column comprises:
  making the at least one row or at least one column as dormant.

41. The apparatus of claim 32, wherein inactivating the at least one row or at least one column comprises:
  making the at least one row or at least one column as unaddressable.

42. The apparatus of claim 32, wherein the reduced memory capacity is equal to a memory capacity of another device that is to be replaced in a computer.

43. An assembly comprising an apparatus; and a device disposed in said apparatus and having a reduced memory capacity and a dormant memory capacity;
  wherein said device having been produced in accordance with the following steps:
  providing the device having a memory capacity;
  determining that the memory capacity of the device can be reduced;
  determining an amount by which the memory capacity of the device is to be reduced;
  reducing the memory capacity of the device in accordance with the determined amount to produce the device having the reduced memory capacity and the dormant memory capacity, wherein the memory capacity is reduced by inactivating at least one row of a memory bank of the device or at least one column of the memory bank of the device; and
  furnishing said apparatus with said device having said reduced memory capacity and the dormant memory capacity which is not available for use, wherein the at least one row of the memory bank that is inactivated is made unusable and is prevented from storing data, and wherein the at least one column of the memory bank that is inactivated is made unusable and is prevented from storing data.

44. A computer assembly comprising a computer; and a dual inline memory module (DIMM) disposed in said computer and having a reduced memory capacity and a dormant memory capacity;
  wherein said DIMM having been produced in accordance with the following steps:
  providing the DIMM having a memory capacity;
  determining that the memory capacity of the DIMM can be reduced;
  determining an amount by which the memory capacity of the DIMM is to be reduced; and
  reducing the memory capacity of the DIMM in accordance with the determined amount to produce the DIMM having the reduced memory capacity and the dormant memory capacity, wherein the memory capacity is reduced by inactivating at least one row of a memory bank of the DIMM or at least one column of the memory bank of the DIMM, wherein the at least one row of the memory bank that is inactivated is made unusable and is prevented from storing data, and wherein the at least one column of the memory bank that is inactivated is made unusable and is prevented from storing data.

* * * * *